(12) United States Patent
Zhang et al.

(10) Patent No.: US 11,569,271 B2
(45) Date of Patent: Jan. 31, 2023

(54) DISPLAY PANEL AND METHOD FOR MANUFACTURING THE SAME, AND DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Yuntian Zhang, Beijing (CN); Zhou Rui, Beijing (CN); Peng Jiang, Beijing (CN); Haipeng Yang, Beijing (CN); Ke Dai, Beijing (CN); Chunxu Zhang, Beijing (CN); Zhonghou Wu, Beijing (CN); Li Tian, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 384 days.

(21) Appl. No.: 16/925,863

(22) Filed: Jul. 10, 2020

(65) Prior Publication Data

US 2021/0066349 A1 Mar. 4, 2021

(30) Foreign Application Priority Data

Aug. 30, 2019 (CN) .......................... 201921430474.4

(51) Int. Cl.
*H01L 27/12* (2006.01)

(52) U.S. Cl.
CPC ........ *H01L 27/124* (2013.01); *H01L 27/1259* (2013.01)

(58) Field of Classification Search
CPC ............... H01L 27/124; H01L 27/1259; G02F 1/136286
See application file for complete search history.

(56) References Cited

FOREIGN PATENT DOCUMENTS

CN 105469764 A * 4/2016

* cited by examiner

*Primary Examiner* — Peter M Albrecht
(74) *Attorney, Agent, or Firm* — Dinsmore & Shohl LLP (57) ABSTRACT

A display panel and a method for manufacturing the same, and a display device is provided. The display panel includes a display area including a plurality of gate lines arranged spaced apart in a first direction and a non-display area including a first and a second non-display area. At least one of the first or the second non-display area includes: a gate driving area including a plurality of gate driving units arranged spaced apart in the first direction and connected to the gate lines, a length of at least one gate driving unit being smaller than a length of a pixel in the first direction; a dummy gate driving area including a plurality of dummy gate driving units arranged spaced apart in the first direction; and a first trace area including a plurality of first traces connected to the dummy gate driving units and an external circuit.

20 Claims, 7 Drawing Sheets

DISPLAY PANEL AND METHOD FOR MANUFACTURING THE SAME, AND DISPLAY DEVICE

CROSS-REFERENCE TO RELATED APPLICATIONS

The present disclosure is based on and claims priority to China Patent Application No. 201921430474.4 filed on Aug. 30, 2019, the disclosure of which is incorporated by reference herein in its entirety.

TECHNICAL FIELD

The present disclosure relates to a display panel and a method for manufacturing the same, and a display device.

BACKGROUND

With the development of display technology, the frame of a display panel is narrower and narrower. For the gate driving circuit on the array substrate (Gate On Array, GOA), the reduction in area of the frame of the display panel may compress the space of traces between the gate driving circuit and the external circuit.

SUMMARY

According to one aspect of the embodiments of the present disclosure, a display panel is provided. The display panel comprises: a display area comprising a plurality of gate lines arranged spaced apart in a first direction; and a non-display area surrounding the display area, and comprising a first non-display area and a second non-display area that are located on opposite sides of the display area. At least one of the first non-display area or the second non-display area comprises: a gate driving area comprising a plurality of gate driving units arranged spaced apart in the first direction and connected to the plurality of gate lines, wherein a length of at least one of the plurality of gate driving units in the first direction is smaller than a length of a pixel in the display panel in the first direction; a dummy gate driving area adjacent to the gate driving area and the display area, and comprising a plurality of dummy gate driving units arranged spaced apart in the first direction; and a first trace area adjacent to the dummy gate driving area and comprising a plurality of first traces connected to the plurality of dummy gate driving units and an external circuit.

In some embodiments, the length of each of the plurality of gate driving units in the first direction is smaller than the length of the pixel in the first direction length.

In some embodiments, the plurality of gate driving units has a same length in the first direction.

In some embodiments, the length of each of the plurality of gate driving units in the first direction is 2 microns to 5 microns smaller than the length of the pixel in the first direction.

In some embodiments, a length of each of the plurality of dummy gate driving units in the first direction is less than or equal to the length of the pixel in the first direction.

In some embodiments, the plurality of dummy gate driving units comprises a first group of dummy gate driving units; and the plurality of gate driving units comprises a first group of gate driving units configured to be reset by the first group of dummy gate driving units.

In some embodiments, the plurality of gate driving units, other than the first group of gate driving units, further comprises: a second group of gate driving units located on one side of the first group of gate driving units away from the dummy gate driving area, wherein each of the second group of gate driving units is configured to be reset by another gate driving unit of the plurality of gate driving units.

In some embodiments, the plurality of dummy gate driving units further comprises: a second group of dummy gate driving units located on one side of the first group of dummy gate driving units away from the gate driving area and configured to be reset by the external circuit.

In some embodiments, the at least one of the first non-display area or the second non-display area further comprises: a second trace area located on one side of the gate driving area away from the dummy gate driving area, adjacent to the gate driving area and the display area, and comprising a plurality of second traces connected to some of the plurality of gate driving units.

In some embodiments, the plurality of second traces is configured to provide input signals to the some of the plurality of gate driving units.

In some embodiments, the non-display area further comprises: a third non-display area adjacent to the first non-display area and the second non-display area respectively, and comprising a plurality of third traces, the plurality of first traces extending to the third non-display area and being connected to the external circuit via the plurality of third traces; and a fourth non-display area located on one side of the display area away from the third display area, and adjacent to the first non-display area and the second non-display area respectively.

In some embodiments, the non-display area further comprises: an external circuit binding area located on one side of the third non-display area away from the display area, and adjacent to the first non-display area, the second non-display area, and the third non-display area respectively, wherein the external circuit is located in the external circuit binding area.

In some embodiments, a length of each of the third non-display area and the fourth non-display area in a second direction perpendicular to the first direction is equal to a length of the display area in the second direction.

In some embodiments, the plurality of gate driving units is connected to the plurality of gate lines in one-to-one correspondence.

In some embodiments, the display panel further comprises a plurality of fourth traces of a same resistance, wherein the plurality of gate driving units is connected to the plurality of gate lines in one-to-one correspondence via the plurality of fourth traces.

In some embodiments, each of the plurality of fourth traces comprises: a plurality of first segments extending along the first direction; and a plurality of second segments extending along a second direction perpendicular to the first direction, wherein the plurality of second segments and the plurality of first segments are alternately connected.

In some embodiments, the pixel comprises a plurality of sub-pixels arranged in a second direction perpendicular to the first direction, and a length of each of the plurality of sub-pixels in the first direction is equal to the length of the pixel in the first direction.

In some embodiments, the number of the plurality of sub-pixels is three.

According to another aspect of the embodiments of the present disclosure, a display device is provided. The display device comprises the display panel according to any of the above embodiments.

According to a further aspect of the embodiments of the present disclosure, a method for manufacturing a display panel is provided. The method comprises forming a display area and a non-display area surrounding the display area. Forming the display area comprises forming a plurality of gate lines arranged spaced apart in a first direction; and forming the non-display area comprises forming a first non-display area and a second non-display area that are located on opposite sides of the display area. Forming at least one of the first non-display area or the second non-display area comprises: forming a gate driving area comprising a plurality of gate driving units arranged spaced apart in the first direction and connected to the plurality of gate lines, wherein a length of at least one of the plurality of gate driving units in the first direction is smaller than a length of a pixel in the display panel in the first direction; forming a dummy gate driving area adjacent to the gate driving area and the display area, and comprising a plurality of dummy gate driving units arranged spaced apart in the first direction; and forming a first trace area adjacent to the dummy gate driving area and comprising a plurality of first traces connected to the plurality of dummy gate driving units and an external circuit.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that in the related art, in order to dispose traces between the gate driving circuit and the external circuit, it is necessary to reduce a width of each trace. This causes a great resistance of each trace, thereby affecting normal driving of the display panel and the display effect of the display panel.

In view of the above, the embodiments of the present disclosure provide the following solutions.

Figure 1A:
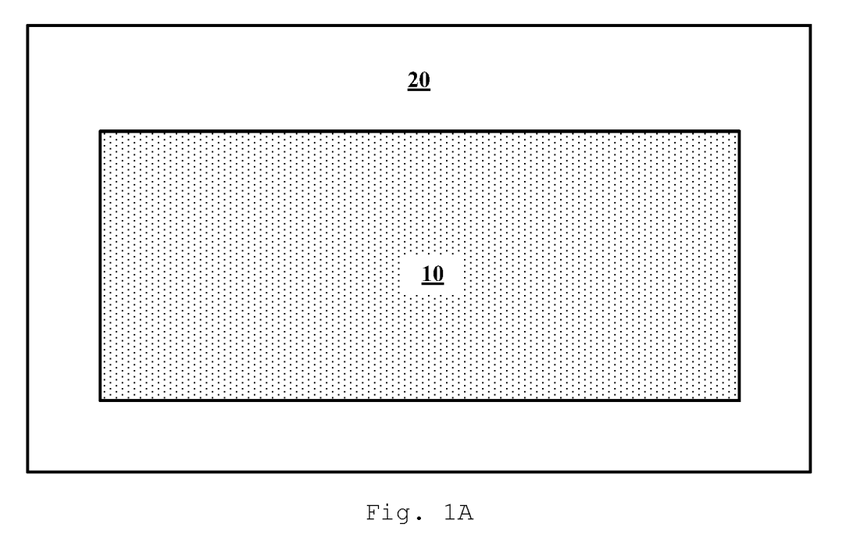
FIGS. 1A and 1B are schematic views of a display panel according to an embodiment of the present disclosure.
Figure 1B:
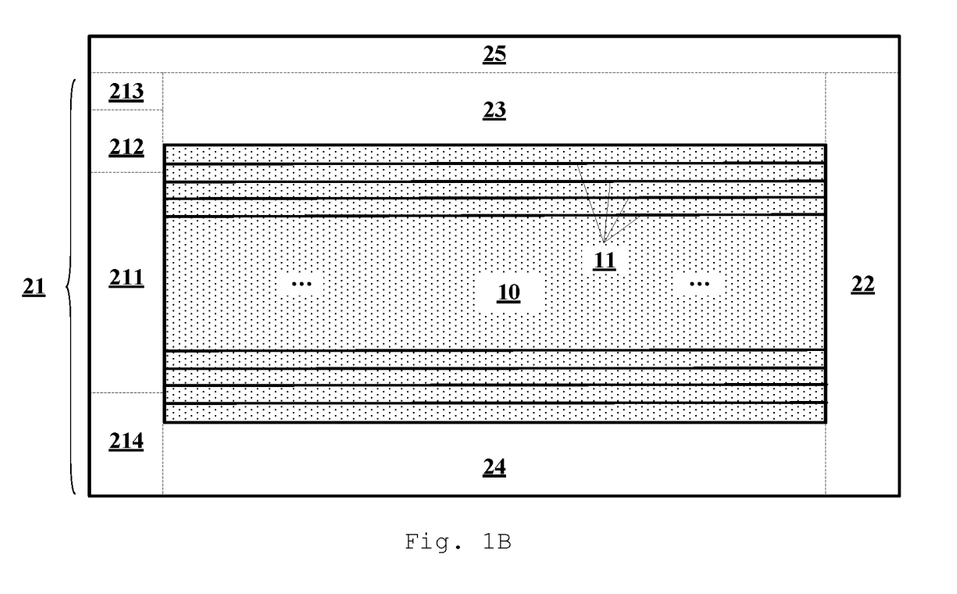

FIGS. 1A and 1B are schematic views of a display panel according to an embodiment of the present disclosure. It should be understood that FIGS. 1A and 1B show the same display panel, but different emphases.

As shown in FIG. 1A, the display panel may comprise a display area 10 and a non-display area 20 surrounding the display area 10. Here, the non-display area 20 may also be referred to as a peripheral area.

The display area 10 comprises a plurality of gate lines 11 arranged spaced apart in a first direction. Here, the first direction may be, for example, a column direction in which a plurality of pixels in the display panel is arranged.

As shown in FIG. 1B, the non-display area 20 comprises a first non-display area 21 and a second non-display area 22 that are located on opposite sides of the display area 10.

In some embodiments, the non-display area 20 further comprises a third non-display area 23 and a fourth non-display area 24 that is located on one side of the display area 10 away from the third non-display area 23. Each of the third non-display area 23 and the fourth non-display area 24 is adjacent to the first non-display area 21 and the second non-display area 22 respectively. In some embodiments, the length of each of the third non-display area 23 and the fourth non-display area 24 in a second direction perpendicular to the first direction is equal to the length of the display area 10 in the second direction. Here, the second direction may be, for example, a row direction in which the plurality of pixels in the display panel is arranged. In some embodiments, the non-display area 20 further comprises an external circuit binding area 25 on one side of the third non-display area 23 away from the display area 10. The external circuit binding area 25 is adjacent to the first non-display area 21, the second non-display area 22, and the third non-display area 23 respectively.

At least one of the first non-display area 21 or the second non-display area 22 comprises a gate driving area, a dummy gate driving area, and a first trace area. Next, description will be made with the first non-display area 21 as an example in conjunction with FIG. 1B.

Referring to FIG. 1B, the first non-display area 21 may comprise a gate driving area 211, a dummy gate driving area 212 and a first trace area 213. The dummy gate driving area 212 is adjacent to the gate driving area 211 and the display area 10, and the first trace area 213 is adjacent to the dummy gate driving area 212. It should be understood that the first trace area 213 is also adjacent to the third non-display area 23 and the external circuit binding area 25. The gate driving area 211 may be referred to as gate driving circuit area, and the dummy gate driving area 212 may be referred to as dummy gate driving circuit area.

Figure 1C:
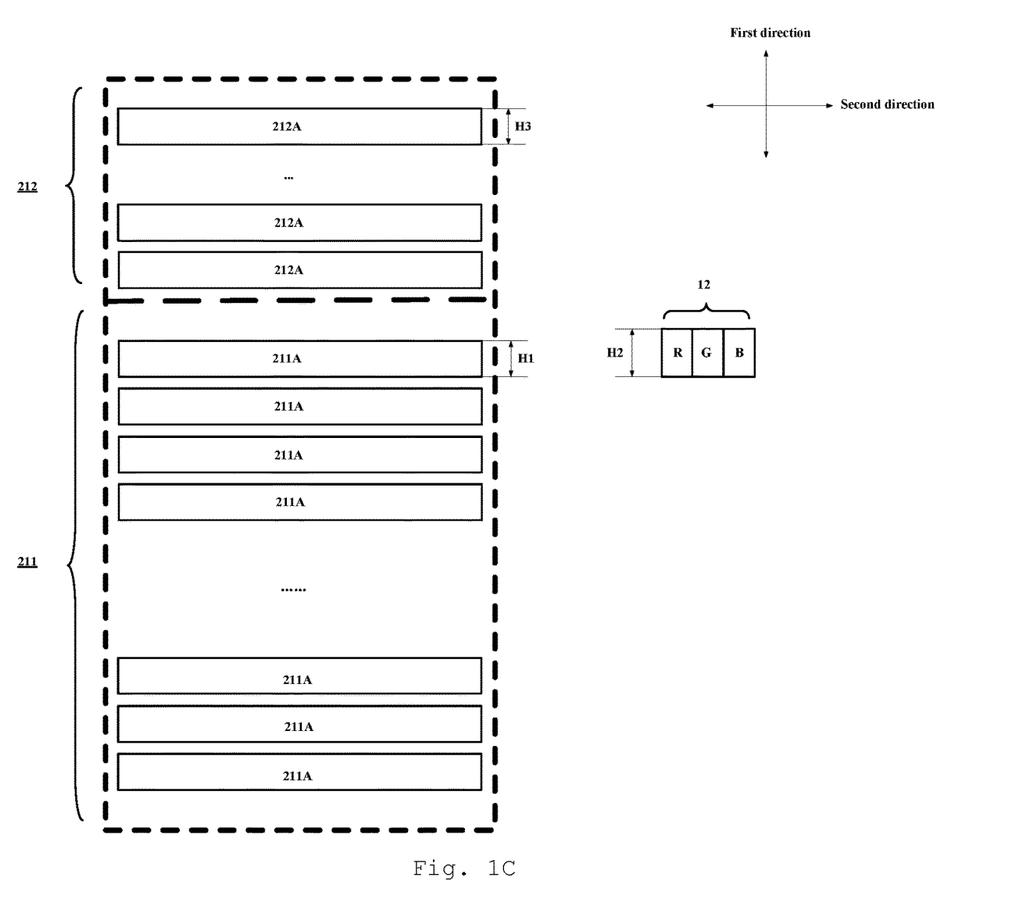
FIGS. 1C and 1D are partial enlarged schematic views of the display panel shown in FIGS. 1A and 1B.
Figure 1D:
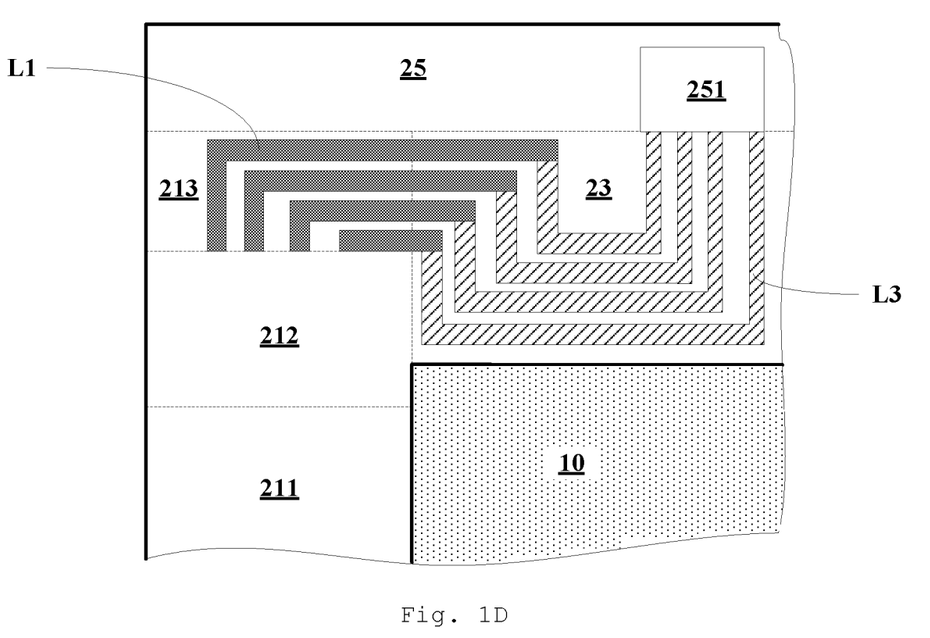

FIGS. 1C and 1D are partially enlarged schematic views of the display panel shown in FIGS. 1A and 1B.

As shown in FIG. 1C, the gate driving area 211 comprises a plurality of gate driving units 211A (may be referred to a plurality of gate driving sub-circuit 211A) arranged spaced apart in the first direction. The plurality of gate driving units 211A may be, for example, a plurality of cascaded shift registers. The plurality of gate driving units 211A are connected to the plurality of gate lines 11 shown in FIG. 1B, for example, in one-to-one correspondence. Among the plurality of gate driving units 211A, a length H1 of at least one gate driving unit 211A in the first direction is smaller than a length H2 of a pixel 12 of the display panel in the first direction. Here, each pixel 12 in the display panel may comprise, for example, a plurality of sub-pixels (e.g. three pixels) arranged in the second direction. The length of each sub-pixel in the first direction is equal to the length H2 of the pixel 12 in the first direction. In some implementations, the plurality of sub-pixels may also comprise more than three sub-pixels. The plurality of sub-pixels may comprise a red sub-pixel R, a green sub-pixel G, and a blue sub-pixel B, for example.

For example, the length(s) H1 of some of the gate driving units 211A in the first direction in the plurality of gate driving units 211A is smaller than the length H2 of the pixel 12 in the first direction. For another example, the length H1 of each of the plurality of gate driving units 211A in the first direction is smaller than the length H2 of the pixel 12 in the first direction. In some embodiments, the length H1 of each gate driving unit 211A in the first direction may be equal, for example, smaller than the length H2 of the pixel 12 in the first direction.

The dummy gate driving area 212 comprises a plurality of dummy gate driving units 212A (may be referred to a plurality of dummy gate driving sub-circuit 212A) arranged spaced apart in the first direction. The plurality of dummy gate driving units 212A may be, for example, a plurality of cascaded virtual shift registers. In some embodiments, the length H3 of each dummy gate driving unit 212A in the first direction may be less than or equal to the length H2 of the pixel 12 in the first direction. It should be understood that the plurality of dummy gate driving units 212A is not connected to the plurality of gate lines 11 of the display area 10, that is, not configured to drive pixels 12 in the display area 10 to emit light.

As shown in FIG. 1D, the first trace area 213 comprises a plurality of first traces L1 connected to the plurality of dummy gate driving units 212A and an external circuit 251. For example, the external circuit 251 is in the external circuit binding area 25.

In the above embodiments, the length of at least one gate driving unit in the first direction is smaller than the length of the pixel in the first direction. In this way, the length of the gate driving area 211 in the first direction may be reduced, and the dummy gate driving area 212 may move toward the gate driving area 211 so as to be adjacent to the display area 10, thereby increasing the space of the first trace area 213. Such a display panel may increase the space of the first trace area 213 and reduce the resistances of the first traces, thereby improving the display effect of the display panel.

In some embodiments, the length H1 of at least one of the plurality of gate driving units 211A in the first direction may be 2 to 5 microns (e.g., 3 microns, 4 microns, etc.) smaller than the length H2 of the pixel 12 in the first direction. Within such a range of length difference, the performance of the gate driving unit 211A may not be affected. Such a display panel may increase the space of the first trace area 213 without affecting the driving of the pixel 12 by the gate driving unit 211A substantially, thereby having a further improved display effect.

Figure 2:
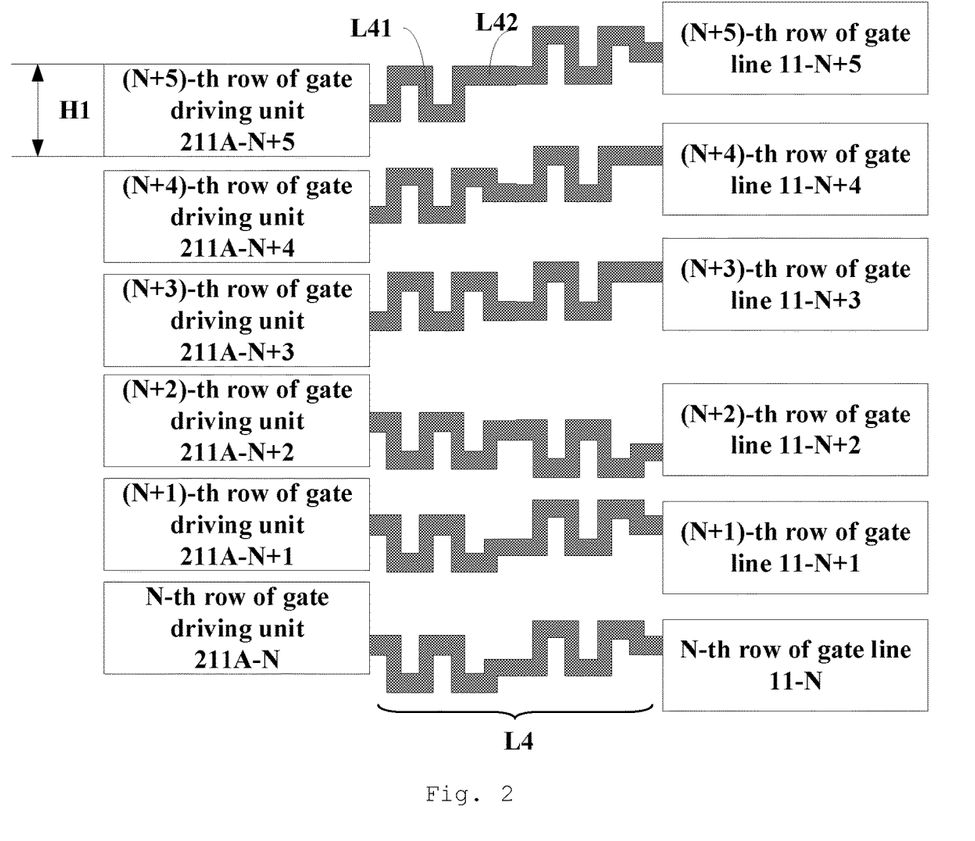
FIG. 2 is a schematic view showing connection of a plurality of gate driving units and a plurality of gate lines according to an embodiment of the present disclosure.

FIG. 2 is a schematic view showing connection of a plurality of gate driving units and a plurality of gate lines according to an embodiment of the present disclosure. Here, the plurality of gate driving units 211A and the plurality of gate lines 11 are connected in one-to-one correspondence. FIG. 2 schematically shows six gate driving units 211A and six gate lines 11.

As shown in FIG. 2, the N-th row of gate driving unit 211A-N is connected to the N-th row of gate line 11-N, the (N+1)-th row of gate driving unit 211A-N+1 is connected to the (N+1)-th row of gate line 11-N+1, the (N+2)-th row of gate driving unit 211A-N+2 is connected to the (N+2)-th row of gate line 11-N+2, the (N+3)-th row of gate driving unit 211A-N+3 is connected to the (N+3)-th row of gate line 11-N+3, the (N+4)-th row of gate driving unit 211A-N+4 is connected to the (N+4)-th row of gate line 11-N+4, and the (N+5)-th row of gate driving unit 211A-N+5 is connected to the (N+5)-th row of gate line 11-N+5.

In some embodiments, referring to the FIG. 2, the display panel further comprises a plurality of traces L4 (referred to as a plurality of fourth traces). The plurality of gate driving units 211A is connected to the plurality of gate lines 11 in one-to-one correspondence via the plurality of fourth traces L4. The resistances of the plurality of fourth traces L4 are equal. In other words, the trace L4 connected between each gate driving unit 211A and a corresponding gate line 11 has a same resistance. It should be understood that since the length(s) of the gate driving unit(s) 211A in the first direction is reduced, the gate driving unit(s) 211A and the corresponding gate line(s) 11 are no longer on the same horizontal line. In order to make the resistances of different fourth traces L4 be equal, the embodiments of the present disclosure provide the following solution.

For example, referring to FIG. 2, the fourth trace L4 may comprise a plurality of first segments L41 extending along the first direction and a plurality of second segments L42 extending along the second direction. The plurality of first segments L41 are alternately connected to the plurality of second segments L42. For example, the fourth trace L4 may comprise a second segment L42, a first segment L41, a second segment L42 and a first segment L41 sequentially connected from the gate driving unit to the corresponding gate line. The fourth trace L4 in such a wiring manner may be referred to as a serpentine trace.

Figure 3A:
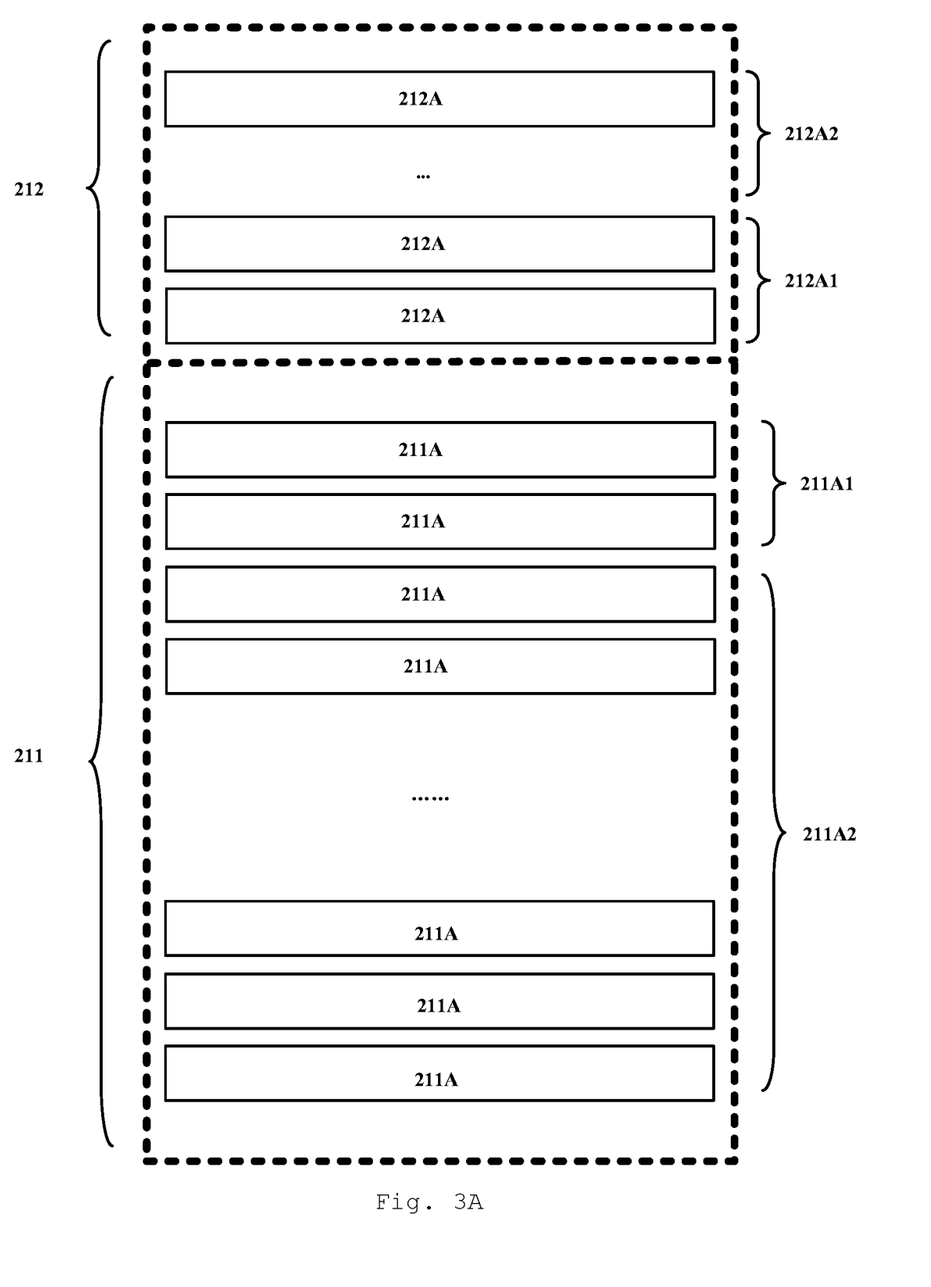
FIG. 3A is a partial schematic view of a display panel according to an embodiment of the present disclosure.

FIG. 3A is a partially enlarged schematic view of a display panel according to an embodiment of the present disclosure.

In some embodiments, as shown in FIG. 3A, the plurality of dummy gate driving units 212A in the dummy gate driving area 212 may comprise a first group of dummy gate driving units 212A1. The plurality of gate driving units 211A in the gate driving area 211 comprises a first group of gate driving units 211A1 configured to be reset by the first group of dummy gate driving units 212A1. For example, the first group of gate driving units 211A1 corresponds to the first group of dummy gate driving units 212A1 in one-to-one correspondence. Each of the first group of gate driving units 211A1 is reset by a corresponding dummy gate driving unit 212A of the first group of dummy gate driving units 212A1.

In some embodiments, referring to FIG. 3A, the plurality of dummy gate driving units 212A in the dummy gate driving area 212 further comprises a second group of dummy gate driving units 212A2 located on one side of the first group of dummy gate driving units 212A1 away from the gate driving area 211. In other words, the first group of dummy gate driving units 212A1 is closer to the gate driving area 211 than the second group of dummy gate driving units 212A2. The second group of dummy gate driving units 212A2 are configured to be reset by the external circuit 251.

In some embodiments, the first group of dummy gate driving units 212A1 are configured to reset some of the plurality of gate driving units 211A, and the second group of dummy gate driving units 212A2 are configured to be reset by a signal from the external circuit 251.

In some embodiments, the plurality of gate driving units 211A in the gate driving area 211 further comprises a second group of gate driving units 211A2 other than the first group of gate driving units 211A1. The second group of gate driving units 211A2 are located on one side of the first group of gate driving units 211A1 away from the dummy gate driving area 212 and configured to be reset by the plurality of gate driving units 211A. It should be understood that each of the second group of gate driving units 211A2 is reset by another gate driving unit 211A of the plurality of gate driving units 211A. For example, a gate driving unit 211A is reset by the next-stage gate driving unit 211A of this gate driving unit 212A.

In this way, a gate driving unit 211A for driving the pixel 12 is either reset by another gate driving unit 211A or reset by a dummy gate driving unit 212A1 in the first group of dummy gate driving units 212A1, rather than reset by a signal from the external circuit 251. The signal from the external circuit 251 is different from a signal output by the gate driving unit 211A, while a signal output by the dummy gate driving unit 212A1 is similar to the signal output by the gate driving unit 211A. Thus, the stability of the plurality of gate driving units 211A may be improved, and the display effect of the display panel are further improved.

For example, the number of the plurality of dummy gate driving units 212A may be 6 to 10. The numbers of the first group of dummy gate driving units 212A1 and the second group of dummy gate driving units 212A2 may be the same, for example, three to five. In this case, three to five gate driving units 211A (i.e., the first group of gate driving units 211A1) in the gate driving area 211 are reset by the first group of dummy gate driving units 212A1.

In some embodiments, referring to FIG. 1B, the first non-display area 21 may further comprise a second trace area 214 located on one side of the gate driving area 211 away from the dummy gate driving area 212. The second trace area 214 is adjacent to the gate driving area 211 and the display area 10.

Figure 3B:
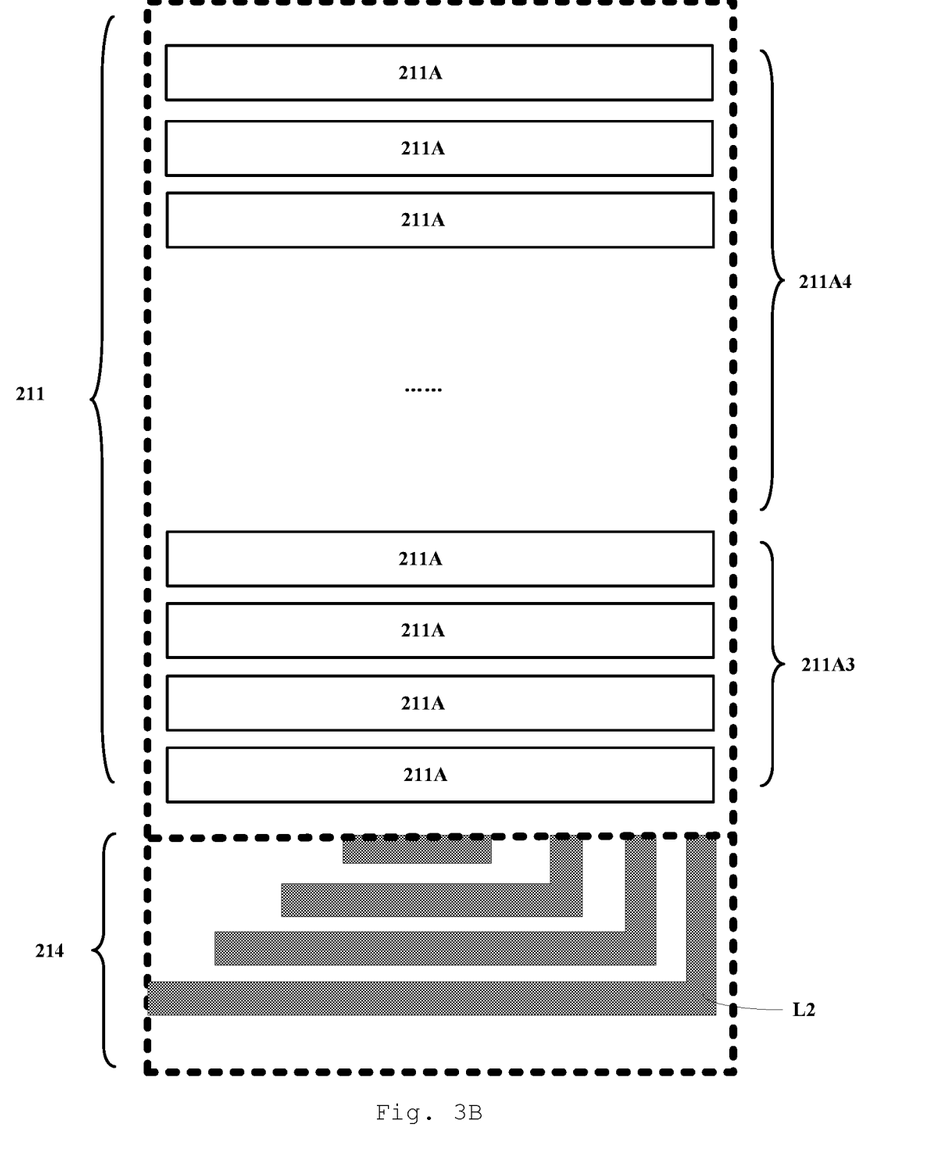
FIG. 3B is a partial schematic view of a display panel according to another embodiment of the present disclosure.

FIG. 3B is a partially enlarged schematic view of a display panel according to another embodiment of the present disclosure.

As shown in FIG. 3B, the second trace area 214 comprises a plurality of second traces L2 connected to some gate driving units 211A (referred to a third group of gate driving units 211A3 below) of the plurality of gate driving units 211A. For example, the plurality of second traces L2 is configured to provide input signals to the third group of gate driving units 211A3. For example, the plurality of second traces L2 corresponds to the third group of gate driving units 211A3 in one-to-one correspondence. Each of the plurality of second traces L2 is configured to provide an input signal to a corresponding gate driving unit 211A of the third group of gate driving units 211A3. Since the length of the gate driving area 211 in the first direction is reduced, the space of the second trace area 214 may be increased. Such a display panel may increase the space of the second trace area 214 and reduce the resistance of the second trace L2, thereby further improving the display effect of the display panel.

In some embodiments, referring to FIG. 3B, the plurality of gate driving units 211A further comprises a fourth group of gate driving units 211A4 other than the third group of gate driving units 211A3. The input signals of the fourth group of gate driving units 211A4 are provided by the plurality of gate driving units 211A. For example, an input signal of a gate driving unit 212A is an output signal of the previous-stage gate driving unit 212A of this gate driving unit 211A.

Figure 4A:
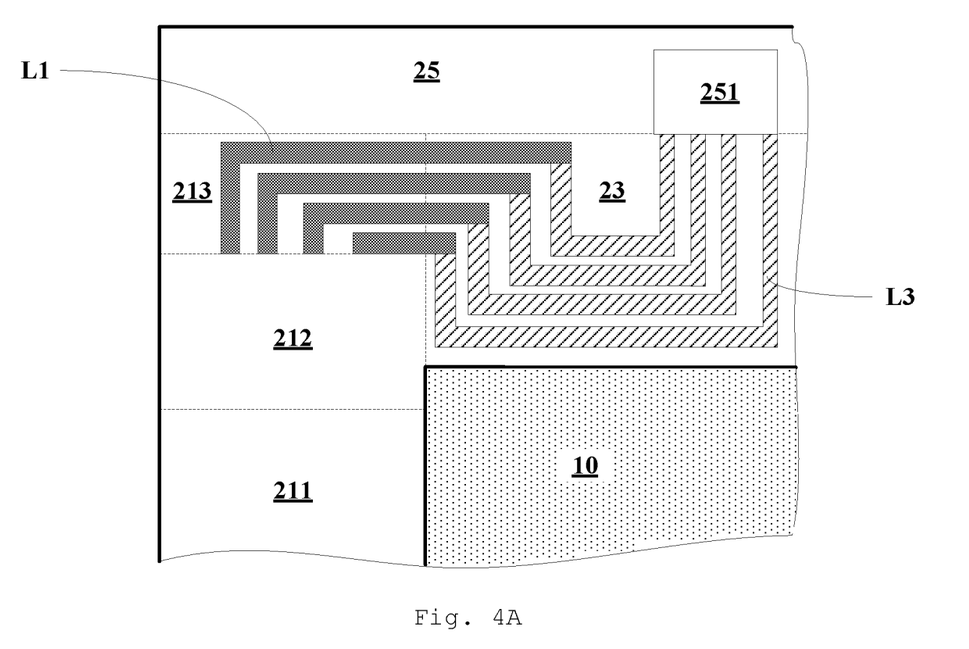
FIG. 4A is a partial schematic view of a display panel according to an embodiment of the present disclosure.
Figure 4B:
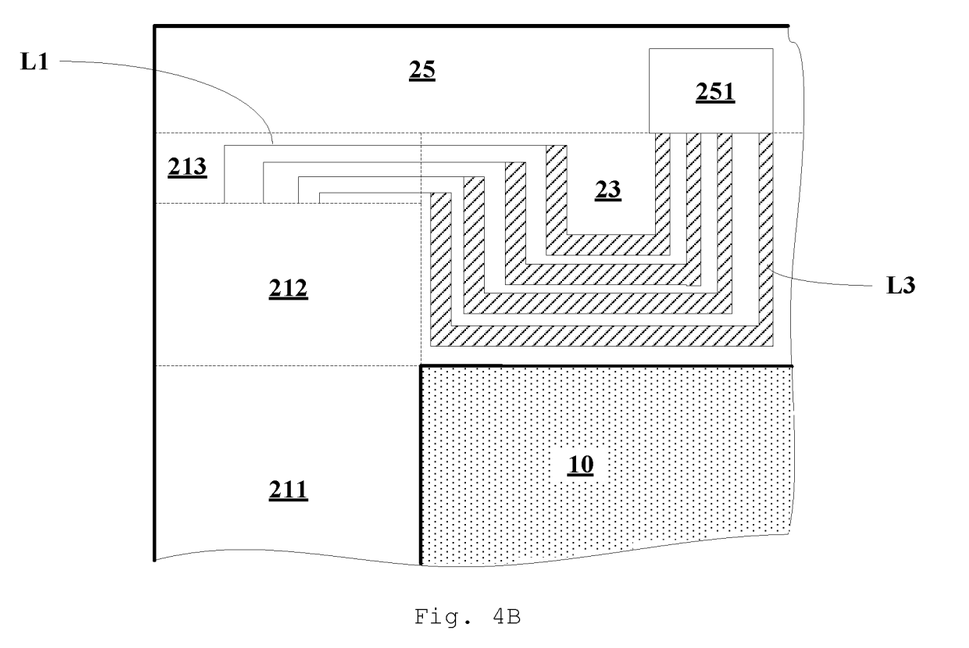
FIG. 4B is a partial schematic view of a display panel in the related art.

FIG. 4A is a partial schematic view of a display panel according to an embodiment of the present disclosure. FIG. 4B is a partial schematic view of a display panel in the related art.

As can be seen from FIG. 4A and FIG. 4B, in a case where the first non-display area 21 has a constant area, the first trace area 213 in the display panel provided by the embodiments of the present disclosure has a greater area than the first trace area 213 in the related art. Therefore, the width of the first trace L1 in FIG. 4A may be set to be larger than the width of the first trace L1 in FIG. 4B.

In some embodiments, referring to FIG. 4A, the external circuit 251 is in the external circuit binding area 25. The third non-display area 23 may comprise a plurality of third traces L3. The plurality of first traces L1 extends to the third non-display area 23 and is connected to the external circuit 241 via the plurality of third traces L3.

The embodiments of the present disclosure also provide a method for manufacturing a display panel. The method comprises a step of forming a display area and a non-display area surrounding the display area. The step of forming the display area comprises forming a plurality of gate lines arranged spaced apart in a first direction. The step of forming the non-display area comprises forming a first non-display area and a second non-display area that are located on opposite sides of the display area.

The step of forming at least one of the first non-display area or the second non-display area comprises a step of forming a gate driving area, a step of forming a dummy gate driving area, and a step of forming a first trace area.

The gate driving area comprises a plurality of gate driving units arranged spaced apart in the first direction and connected to the plurality of gate lines. The length of at least one of the plurality of gate driving units in the first direction is smaller than the length of a pixel in the display panel in the first direction.

The dummy gate driving area is adjacent to the gate driving area and the display area and comprises a plurality of dummy gate driving units arranged spaced apart in the first direction.

The first trace area is adjacent to the dummy gate driving area and comprises a plurality of first traces connected to the plurality of dummy gate driving units and an external circuit.

In the above embodiments, the length of at least one gate driving unit in the first direction is smaller than the length of the pixel in the first direction. In this way, the length of the gate driving area in the first direction may be reduced, and the dummy gate driving area may move toward the gate driving area to be adjacent to the display area, thereby increasing the space of the first trace area. Such a display panel may increase the space of the first trace area and reduce the resistances of the first traces, thereby improving the display effect of the display panel.

The embodiments of the present disclosure also provide a display device, which may comprise the display panel according to any one of the above embodiments. In some embodiments, the display device may be any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
   a display area comprising a plurality of gate lines arranged spaced apart in a first direction; and
   a non-display area surrounding the display area, and comprising a first non-display area and a second non-display area that are located on opposite sides of the display area, wherein at least one of the first non-display area and the second non-display area comprises:
   a gate driving area comprising a plurality of gate driving units arranged spaced apart in the first direction and connected to the plurality of gate lines, wherein a length of at least one of the plurality of gate driving units in the first direction is smaller than a length of a pixel in the display area in the first direction,
   a dummy gate driving area adjacent to the gate driving area and the display area, and comprising a plurality of dummy gate driving units arranged spaced apart in the first direction, and
   a first trace area adjacent to the dummy gate driving area and comprising a plurality of first traces connected to the plurality of dummy gate driving units and an external circuit, wherein the dummy gate driving area overlaps with the display area in a second direction perpendicular to the first direction and does not overlap with the external circuit in the second direction.

2. The display panel of claim 1, wherein the length of each of the plurality of gate driving units in the first direction is smaller than the length of the pixel in the first direction.

3. The display panel of claim 2, wherein the plurality of gate driving units has a same length in the first direction.

4. The display panel of claim 2, wherein the length of each of the plurality of gate driving units in the first direction is 2 microns to 5 microns smaller than the length of the pixel in the first direction.

5. The display panel according to claim 1, wherein a length of each of the plurality of dummy gate driving units in the first direction is less than or equal to the length of the pixel in the first direction.

6. The display panel according to claim 1, wherein:
   the plurality of dummy gate driving units comprises a first group of dummy gate driving units; and
   the plurality of gate driving units comprises a first group of gate driving units configured to be reset by the first group of dummy gate driving units.

7. The display panel of claim 6, wherein the plurality of gate driving units, other than the first group of gate driving units, further comprises:
   a second group of gate driving units located on one side of the first group of gate driving units away from the dummy gate driving area, wherein each of the second group of gate driving units is configured to be reset by another gate driving unit of the plurality of gate driving units.

8. The display panel of claim 6, wherein the plurality of dummy gate driving units further comprises:
   a second group of dummy gate driving units located on one side of the first group of dummy gate driving units away from the gate driving area and configured to be reset by the external circuit.

9. The display panel of claim 1, wherein the at least one of the first non-display area and the second non-display area further comprises:
   a second trace area located on one side of the gate driving area away from the dummy gate driving area, adjacent to the gate driving area and the display area, and comprising a plurality of second traces connected to some of the plurality of gate driving units.

10. The display panel according to claim 9, wherein the plurality of second traces is configured to provide input signals to the some of the plurality of gate driving units.

11. The display panel of claim 1, wherein the non-display area further comprises:
   a third non-display area adjacent to the first non-display area and the second non-display area respectively, and comprising a plurality of third traces, the plurality of first traces extending to the third non-display area and being connected to the external circuit via the plurality of third traces; and a fourth non-display area located on one side of the display area away from the third non-display area, and adjacent to the first non-display area and the second non-display area respectively.

12. The display panel according to claim 11, wherein the non-display area further comprises:

an external circuit binding area located on one side of the third non-display area away from the display area, and adjacent to the first non-display area, the second non-display area, and the third non-display area respectively, wherein the external circuit is located in the external circuit binding area.

13. The display panel of claim 11, wherein a length of each of the third non-display area and the fourth non-display area in the second direction is equal to a length of the display area in the second direction.

14. The display panel of claim 1, wherein the plurality of gate driving units is connected to the plurality of gate lines in one-to-one correspondence.

15. The display panel according to claim 14, further comprising a plurality of fourth traces of a same resistance, wherein the plurality of gate driving units is connected to the plurality of gate lines in one-to-one correspondence via the plurality of fourth traces.

16. The display panel according to claim 15, wherein each of the plurality of fourth traces comprises:

a plurality of first segments extending along the first direction; and a plurality of second segments extending along the second direction, wherein the plurality of second segments and the plurality of first segments are alternately connected.

17. The display panel of claim 1, wherein the pixel comprises a plurality of sub-pixels arranged in the second direction, and a length of each of the plurality of sub-pixels in the first direction is equal to the length of the pixel in the first direction.

18. The display panel of claim 17, wherein the number of the plurality of sub-pixels is three.

19. A display device, comprising a display panel comprising:

a display area comprising a plurality of gate lines arranged spaced apart in a first direction; and a non-display area surrounding the display area, and comprising a first non-display area and a second non-display area that are located on opposite sides of the display area, wherein at least one of the first non-display area and the second non-display area comprises:

a gate driving area comprising a plurality of gate driving units arranged spaced apart in the first direction and connected to the plurality of gate lines, wherein a length of at least one of the plurality of gate driving units in the first direction is smaller than a length of a pixel in the display area in the first direction, a dummy gate driving area adjacent to the gate driving area and the display area, and comprising a plurality of dummy gate driving units arranged spaced apart in the first direction, and a first trace area adjacent to the dummy gate driving area and comprising a plurality of first traces connected to the plurality of dummy gate driving units and an external circuit, wherein the dummy gate driving area overlaps with the display area in a second direction perpendicular to the first direction and does not overlap with the external circuit in the second direction.

20. A method for manufacturing a display panel, comprising forming a display area and a non-display area surrounding the display area, wherein:

forming the display area comprises:

forming a plurality of gate lines arranged spaced apart in a first direction; and forming the non-display area comprises:

forming a first non-display area and a second non-display area that are located on opposite sides of the display area, wherein forming at least one of the first non-display area and the second non-display area comprises:

forming a gate driving area comprising a plurality of gate driving units arranged spaced apart in the first direction and connected to the plurality of gate lines, wherein a length of at least one of the plurality of gate driving units in the first direction is smaller than a length of a pixel in the display area in the first direction, forming a dummy gate driving area adjacent to the gate driving area and the display area, and comprising a plurality of dummy gate driving units arranged spaced apart in the first direction, and forming a first trace area adjacent to the dummy gate driving area and comprising a plurality of first traces connected to the plurality of dummy gate driving units and an external circuit, wherein the dummy gate driving area overlaps with the display area in a second direction perpendicular to the first direction and does not overlap with the external circuit in the second direction.

* * * * *